United States Patent
Fukushige et al.

(10) Patent No.: US 7,836,263 B2
(45) Date of Patent: Nov. 16, 2010

(54) NONVOLATILE MEMORY CONTROLLING METHOD AND NONVOLATILE MEMORY CONTROLLING APPARATUS

(75) Inventors: Takahiro Fukushige, Tokyo (JP); Kenichi Satori, Tokyo (JP); Kenichi Nakanishi, Tokyo (JP); Hideaki Bando, Tokyo (JP); Junko Sasaki, Tokyo (JP); Kunihiko Miura, Kanagawa (JP); Toshinori Nakamura, Kanagawa (JP); Kensuke Hatsukawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 1109 days.

(21) Appl. No.: 11/047,723

(22) Filed: Feb. 2, 2005

(65) Prior Publication Data

US 2005/0174857 A1    Aug. 11, 2005

(30) Foreign Application Priority Data

Feb. 5, 2004    (JP)    ............................ P2004-029551

(51) Int. Cl.
G06F 13/00    (2006.01)
G06F 13/28    (2006.01)
G06F 12/06    (2006.01)

(52) U.S. Cl. ..................... 711/157; 711/5; 711/E12.079
(58) Field of Classification Search ............. 365/189.04
See application file for complete search history.

(56) References Cited

U.S. PATENT DOCUMENTS 5,835,935 A    11/1998    Estakhri et al.
5,867,430 A *    2/1999    Chen et al. ............. 365/189.04
6,195,306 B1 *    2/2001    Horiguchi et al. ........... 365/226
6,215,705 B1 *    4/2001    Al-Shamma ........... 365/189.04
2004/0210729 A1 *    10/2004    Horii et al. .................. 711/156

FOREIGN PATENT DOCUMENTS

JP    2003-508861 A    3/2003

OTHER PUBLICATIONS

Japanese Office Action, #2004-029551, Jan. 24, 2007 (2 pages).

* cited by examiner

Primary Examiner—Kevin Verbrugge
Assistant Examiner—Eric S Cardwell
(74) Attorney, Agent, or Firm—Rader, Fishman & Grauer PLLC

(57) ABSTRACT

A nonvolatile-memory controlling method is disclosed which continuously accesses a plurality of memory banks structured so as to have each memory bank accessible independently. The method comprises the steps of: in a busy cycle of one of the plurality of memory banks being accessed, issuing access information to a second memory bank for access thereto; bringing the second memory bank into a selected state while the access information is being issued to the second memory bank using a selection signal for controlling a selected state and an unselected state for any one of the plurality of memory banks; bringing the memory bank in the busy cycle into an unselected state while the access information is being issued; and accessing the plurality of memory banks continuously based on the access information issued to the second memory bank in the busy cycle of one of the memory banks being accessed and in keeping with the selection signal for controlling the second memory bank.

10 Claims, 4 Drawing Sheets

NONVOLATILE MEMORY CONTROLLING METHOD AND NONVOLATILE MEMORY CONTROLLING APPARATUS

BACKGROUND OF THE INVENTION

The present invention relates to a method and an apparatus for controlling access to nonvolatile memories. More particularly, the invention relates to a nonvolatile-memory controlling method and a nonvolatile-memory controlling apparatus for implementing high-speed access to a nonvolatile memory in an efficient manner.

In recent years, nonvolatile memories have been used as record-holding media, particularly in the field of communication equipment. Communication devices, meanwhile, are increasingly required today to permit high-speed access to data in their memories.

FIG. 1 is a block diagram showing a typical structure of a conventional nonvolatile-memory controlling apparatus capable of writing and reading information to and from a nonvolatile memory 200. The nonvolatile memory 200 includes a plurality of memory banks (banks 0, 1, 2 and 3). The nonvolatile-memory controlling apparatus 100 includes a memory control register block 101, an input/output data control block 102, a control-signal generation block 103, and a chip enable control block 104.

The memory control register block 101 is made up of various registers necessary for controlling memory operations, including writing and reading data to and from the nonvolatile memory 200.

The input/output data control block 102 controls data being input to and output from the nonvolatile-memory controlling apparatus 100. The input and output data include write data to be written to the nonvolatile memory 200 and read data that have been read from the memory 200.

The control-signal generation block 103 generates various control signals, including a command-latch enable signal CLE, an address-latch enable signal ALE, a write enable signal XWE, a read enable signal XRE, and a busy signal XBSY.

The chip enable control block 104 controls chip enable signals XCE0, XCE1, XCE2, and XCE3 with regard to the banks 0, 1, 2 and 3, respectively.

The workings of the nonvolatile-memory controlling apparatus 100 are outlined below. A conventional page access scheme adopted by the controlling apparatus 100 permits writing and reading of data on a single-page access basis only. A command is issued from an I/O terminal, not shown, of the controlling apparatus 100 to the nonvolatile memory 200. If a mapping area in the nonvolatile memory 200 is hit, the controlling apparatus 100 waits for predetermined access cycles in which data can be written or read to or from the area in the memory 200.

FIG. 2 is a timing chart illustrating a read operation of the conventional nonvolatile-memory controlling apparatus 100 with regard to information stored in the nonvolatile memory 200. As illustrated in the timing chart, access cycles over a predetermined time period are needed to allow data to be written to or read from the nonvolatile memory 200. In a common nonvolatile-memory setup, the access cycles start with a command cycle followed by an address cycle, a busy cycle and a data cycle, in that order.

Gaining access to the conventional nonvolatile memory 200 requires a predetermined access time for each read or write cycle. The access time includes a busy wait time. It is the access time, notably the busy wait time as part of it, that determines how long it takes to write or read information to or from the nonvolatile memory 200.

Solutions have been proposed to shorten the busy wait time in the access time for the nonvolatile memory in order to implement efficient memory access. One such solution, disclosed in Japanese Patent Laid-open No. 2003-36681, involves providing a plurality of memory banks each operable independently as a memory and a control block for controlling the memory banks in operation. The control block is capable of operating in interleave operation mode or in parallel operation mode. In interleave operation mode, the control block can respond to an operation command designating a first memory bank and start performing the designated memory operation on the first memory bank while carrying out a memory operation on a second memory bank in response to another operation command issued earlier and designating the second memory bank. In parallel operation mode, if a memory operation command designating one memory bank is issued while another operation command issued earlier and designating another memory bank is about to be carried out, the control block starts executing the memory operations parallelly on the two memory banks. That is, during a memory operation on one memory bank in response to one operation command, this conventional nonvolatile-memory controlling apparatus can respond to another operation command designating another memory bank and carry out the designated memory operation on the latter bank accordingly. The shortest time required for completing an interleave write operation is defined as 2T1+T2, where T1 stands for the command input time regarding banks 0 and 1, and T2 denotes the operation time taken for the memory banks 0 and 1.

The conventional nonvolatile-memory controlling apparatus outlined above has its share of disadvantages. One disadvantage is that during access to the conventional nonvolatile memory, the controlling apparatus needs to take a predetermined access time for a single read or write cycle. The time required to write or read information is thus determined by the access time, notably the busy wait time as part of it. Another disadvantage is that the conventional nonvolatile-memory controlling apparatus needs elaborate circuit structures to let two memory banks operate in parallel so as to achieve a shortened busy state period.

SUMMARY OF THE INVENTION

The present invention has been made in view of the above circumstances and provides a nonvolatile-memory controlling method and a nonvolatile-memory controlling apparatus for continuously gaining access to different memory banks for high-speed memory access at a low level of power dissipation.

In carrying out the invention and according to a first aspect thereof, there is provided a nonvolatile-memory controlling method for continuously accessing a plurality of memory banks structured so as to have each memory bank accessible independently. The nonvolatile-memory controlling method includes the steps of: in a busy cycle of one of the plurality of memory banks being accessed, issuing access information to a second memory bank for access thereto; bringing the second memory bank into a selected state while the access information is being issued to the second memory bank using a selection signal for controlling a selected state and an unselected state for any one of the plurality of memory banks; bringing the memory bank in the busy cycle into an unselected state while the access information is being issued; and accessing the plurality of memory banks continuously based on the access information issued to the second memory bank in the busy cycle of one of the memory banks being accessed and in keeping with the selection signal for controlling the second memory bank.

According to a second aspect of the invention, there is provided a nonvolatile-memory controlling apparatus for continuously accessing a plurality of memory banks, the nonvolatile-memory controlling apparatus including: an access information generating unit for generating access information for gaining access to the plurality of memory banks structured so as to have each memory bank accessed independently; a switching unit which, in a busy cycle of one of the plurality of memory banks being accessed, issues the access information to a second memory bank for access thereto; and a memory bank selecting unit which, using a selection signal for controlling a selected state and an unselected state for any one of the plurality of memory banks, brings the second memory bank into the selected state while the access information is being issued to the second memory bank, the memory bank selecting unit further bringing the memory bank in the busy cycle into the unselected state while the access information is being issued.

As outlined above, the nonvolatile-memory controlling method and nonvolatile-memory controlling apparatus according to the invention are structured to permit continuous, high-speed access to a plurality of memory banks at a low level of power dissipation.

Other objects, features and advantages of the present invention will become more apparent in the following specification and accompanying drawings.

DETAILED DESCRIPTION OF THE PREFERRED EMBODIMENTS

The major object of this invention is to continuously access different memory banks for high-speed memory access at a low level of power dissipation. That object, among others, is achieved by the inventive nonvolatile-memory controlling method for continuously accessing a plurality of memory banks structured so as to have each memory bank accessible independently. The method includes the steps of: in a busy cycle of one of the plurality of memory banks being accessed, issuing access information to a second memory bank for access thereto; bringing the second memory bank into a selected state while the access information is being issued to the second memory bank using a selection signal for controlling a selected state and an unselected state for any one of the plurality of memory banks; bringing the memory bank in the busy cycle into an unselected state while the access information is being issued; and accessing the plurality of memory banks continuously based on the access information issued to the second memory bank in the busy cycle of one of the memory banks being accessed and in keeping with the selection signal for controlling the second memory bank.

The above-mentioned object of this invention, i.e., the continuously accessing of different memory banks for high-speed memory access at a low level of power dissipation, also is accomplished by the inventive nonvolatile-memory controlling apparatus for continuously accessing a plurality of memory banks. The apparatus includes an access information generating unit for generating access information for gaining access to the plurality of memory banks structured so as to have each memory bank accessed independently; a switching unit which, in a busy cycle of one of the plurality of memory banks being accessed, issues the access information to a second memory bank for access thereto; and a memory bank selecting unit which, using a selection signal for controlling a selected state and an unselected state for any one of the plurality of memory banks, brings the second memory bank into the selected state while the access information is being issued to the second memory bank, the memory bank selecting unit further bringing the memory bank in the busy cycle into the unselected state while the access information is being issued.

First Embodiment

Figure 3:
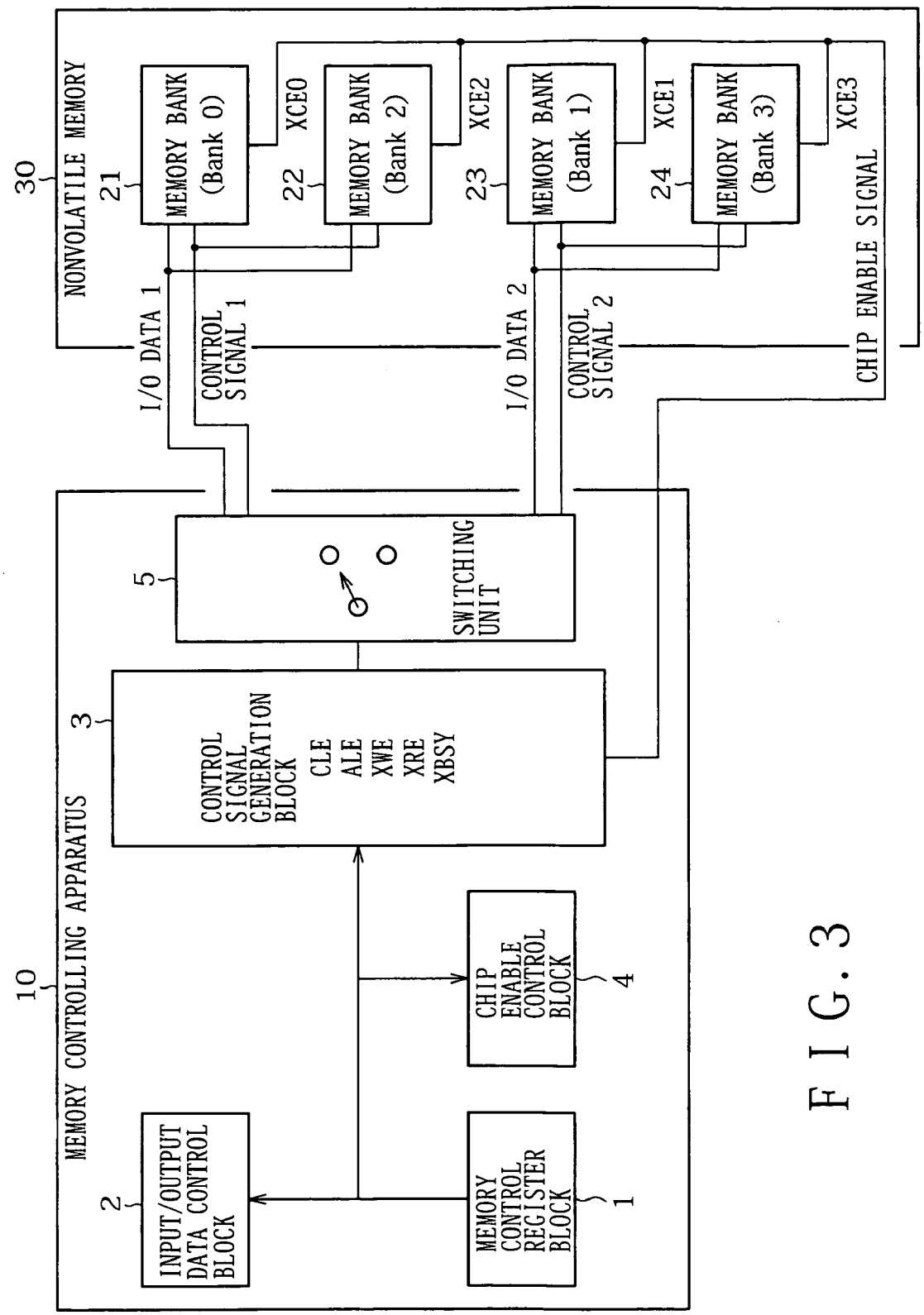
FIG. 3 is a block diagram depicting a typical structure of a nonvolatile-memory controlling apparatus for use with a nonvolatile-memory controlling method, the apparatus and the method being practiced as a first embodiment of this invention.

FIG. 3 is a block diagram depicting a typical structure of a nonvolatile-memory controlling apparatus 10 for use with a nonvolatile-memory controlling method, the apparatus and the method being practiced as the first embodiment of this invention. The nonvolatile-memory controlling apparatus 10 is capable of deleting, writing, and reading data to and from a nonvolatile memory 30, including a plurality of memory banks (banks 0, 1, 2 and 3).

In the nonvolatile memory 30, a memory bank (bank 0) 21 is paired with a memory bank (bank 2) 22 for memory operations based on I/O data 1 and a control signal 1. A memory bank (bank 1) 23 is paired with a memory bank (bank 3) 24 for memory operations based on I/O data 2 and a control signal 2.

In other words, the pair of memory bank (bank 0) 21 and memory bank (bank 2) 22 and the pair of the memory bank (bank 2) 23 and memory bank (bank 3) 24 are made accessible independently of one another in the nonvolatile memory 30, the first memory bank pair being operated on in keeping with the I/O data 1 and control signal 1, and the second pair being operated on in accordance with the I/O data 2 and control signal 2.

The nonvolatile-memory controlling apparatus 10 includes a memory control register block 1, an input/output data control block 2, a control-signal generation block (access information generating unit) 3, a chip enable control block (memory bank selecting unit) 4, and a switching unit 5.

The memory control register block 1 is made up of various registers necessary for deleting, writing, and reading data to and from the nonvolatile memory 30.

The input/output data control block 2 controls data being input to and output from the nonvolatile-memory controlling apparatus 10. The input and output data include write data to be written to the nonvolatile memory 30 and read data that has been read from the memory 30.

The control signal generation block 3 generates the control signals 1 and 2, each including a command-latch enable signal CLE, an address-latch enable signal ALE, a write enable signal XWE, a read enable signal XRE, and a busy signal XBSY.

The chip enable control block 4 controls chip enable signals XCE0, XCE1, XCE2, and XCE3 directed at the banks 0, 1, 2 and 3, respectively.

The switching unit 5 switches the timing for issuing the I/O data and control signals to the memory banks. The times at which the switching unit 5 issues the I/O data and control signals to the different memory banks are illustrated in the timing chart of FIG. 4, to be discussed later.

The I/O data 1 and 2 both include record data such as file data and picture data, data for managing the record data, and other program data. The I/O data 1 and 2 are combined with the control signals 1 and 2 respectively to serve as commands and addresses that are used to delete, write and read information to and from memory.

Figure 4:
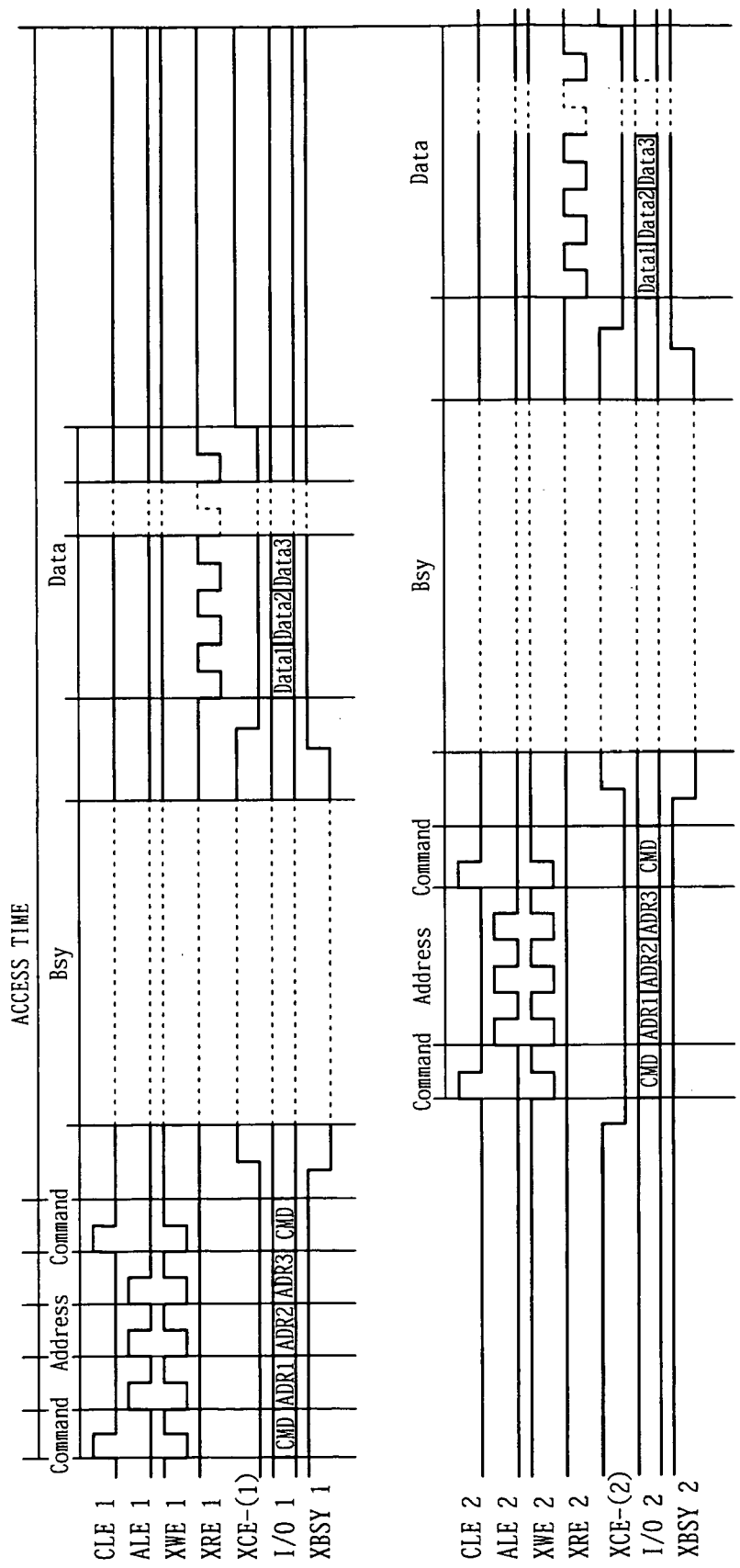
FIG. 4 is a timing chart indicating how the nonvolatile-memory controlling apparatus implemented as part of the first embodiment of the invention typically reads information from a nonvolatile memory.

How the nonvolatile-memory controlling apparatus 10 of the invention works will now be described. FIG. 4 is the timing chart indicating how the nonvolatile-memory controlling apparatus 10 typically reads information from the nonvolatile memory 30.

Figure 1:
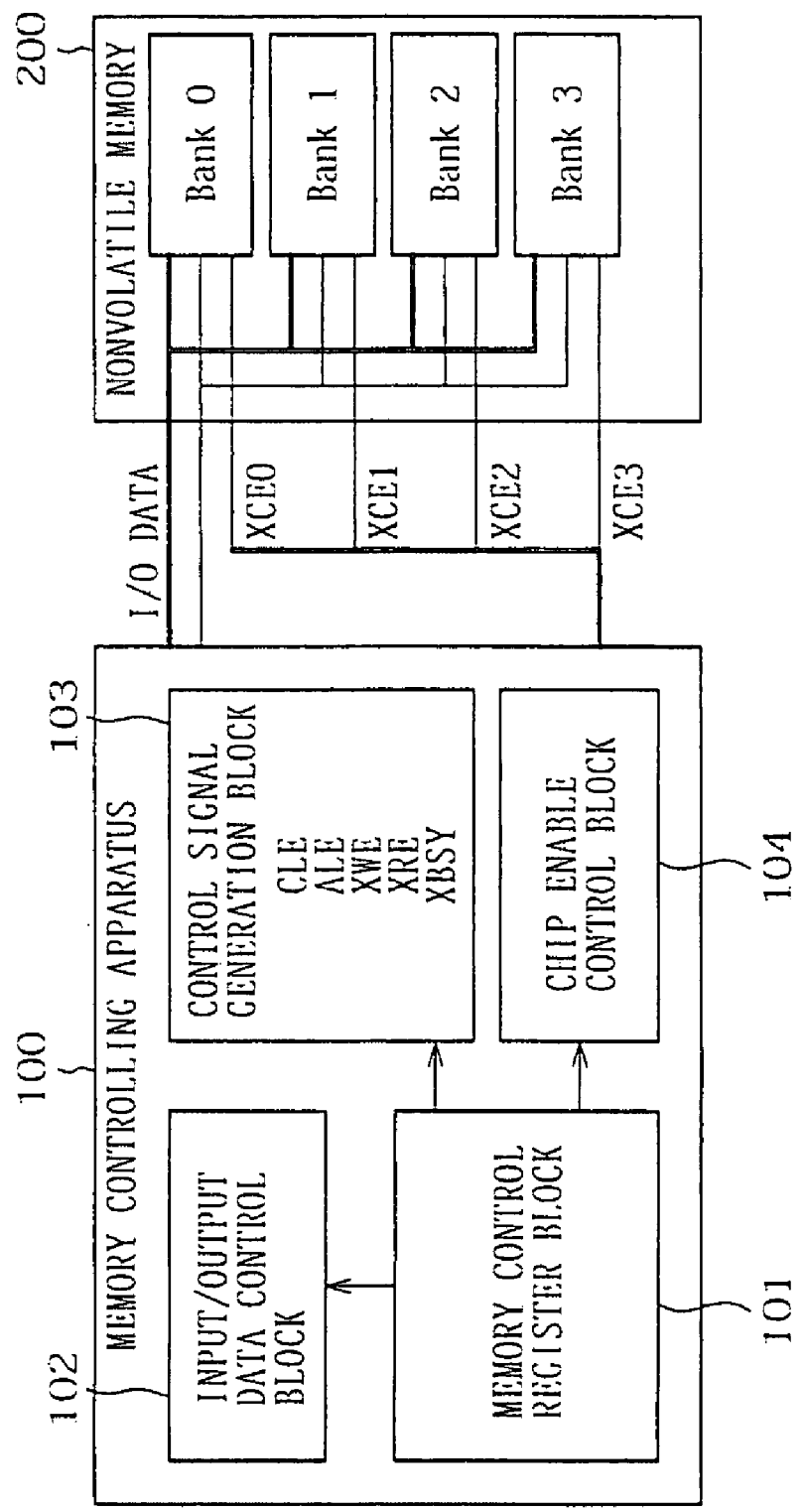
FIG. 1 is a block diagram showing a typical structure of a conventional nonvolatile-memory controlling apparatus.
Figure 2:
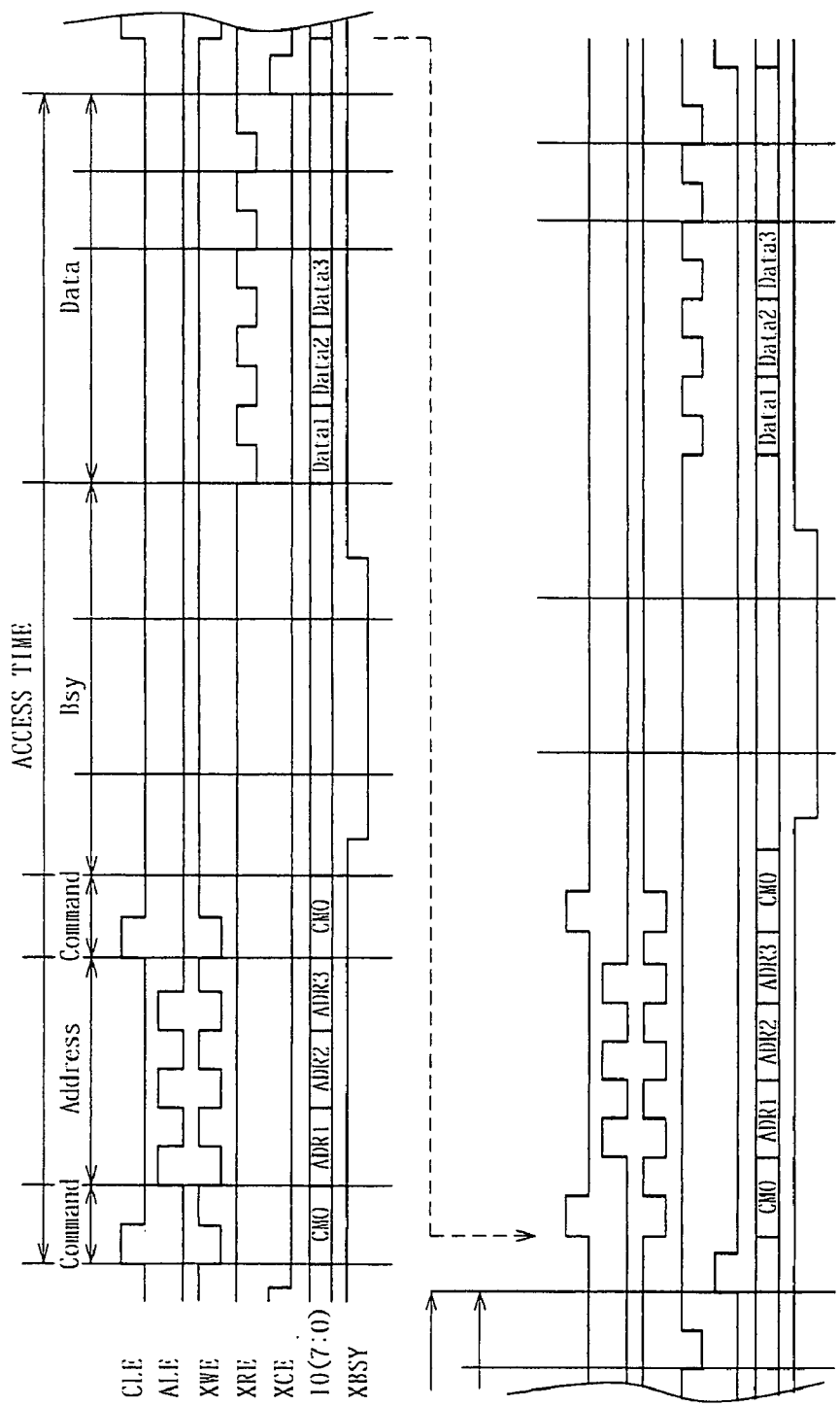
FIG. 2 is a timing chart illustrating a read operation of the conventional nonvolatile-memory controlling apparatus.

In a hypothetical conventional setup, information would be read from the nonvolatile memory 30 in the access cycles starting with a command cycle followed by an address cycle, a busy cycle and a data cycle, in that order, as shown in the timing chart of FIG. 2. By contrast, the nonvolatile-memory controlling apparatus implemented as part of the first embodiment of this invention is structured as depicted in FIG. 3 and has a plurality of sets of control signals directed at different memory banks. In operation, the chip enable signal is disabled for the moment during the busy cycle so that a command cycle is issued for a different bank, whereby a plurality of memory banks are accessed consecutively. In this manner, the nonvolatile memory 30 is accessed rapidly at a reduced level of power dissipation.

Referring to FIG. 4, a command-latch enable signal CLE1, an address-latch enable signal ALE1, a write enable signal XWE1, a read enable signal XRE1, and a busy signal XBSY1 constitute the control signal 1 for controlling the memory operations on the pair of memory bank (bank 0) 21 and memory bank (bank 2) 22. A command-latch enable signal CLE2, an address-latch enable signal ALE2, a write enable signal XWE2, a read enable signal XRE2, and a busy signal XBSY2 make up the control signal 2 for controlling the memory operations on the pair of memory bank (bank 1) 23 and memory bank (bank 3) 24.

A chip enable signal XCE-(1) is directed at the pair of memory bank (bank 0) 21 and memory bank (bank 2) 22. A chip enable signal XCE-(2) is directed at the pair of memory bank (bank 1) 23 and memory bank (bank 3) 24.

The upper part of the timing chart in FIG. 4 shows how information is read from the pair of memory bank (bank 0) 21 and memory bank (bank 2) 22, and the lower part of the timing chart indicates how information is read from the pair of memory bank (bank 1) 23 and memory bank (bank 3) 24. As illustrated in FIG. 4, during the busy cycle where information is being read from the pair of memory bank (bank 0) 21 and memory bank (bank 2) 22, the chip enable signal XCE-(1) is disabled concurrently with the control signal 2 being issued so as to read information from the pair of memory bank (bank 1) 23 and memory bank (bank 3) 24. While the control signal 2 is being issued, the chip enable signal XCE-(2) is enabled.

After information is read from the pair of memory bank (bank 0) 21 and memory bank (bank 2) 22 in the busy cycle, the read data is output as the I/O data 1 in the data cycle that follows. During the data cycle where the I/O data 1 is being output, the busy cycle occurs concurrently, in which information is read from the pair of memory bank (bank 1) 23 and memory bank (bank 3) 24.

During the busy cycle, the chip enable signal XCE-(2) directed at the pair of memory bank (bank 1) 23 and memory bank (bank 3) 24 is disabled so as to reduce the dissipation of power in that memory bank pair. After information is read from the pair of memory bank (bank 1) 23 and memory bank (bank 3) 24 in the busy cycle, the read data is output as the I/O data 2 in the data cycle that follows.

As described, while information is being read from a first memory bank in a busy cycle, the chip enable signal XCE directed at that memory bank is disabled to reduce the dissipation of power in the first memory bank. During the busy cycle, a control signal is issued to a second memory bank so as to read information therefrom.

The busy cycle of the first memory bank is followed by a data cycle in which information is read from the second memory bank in its busy cycle. During the data cycle, the chip enable signal XCE directed at the second memory bank is disabled to reduce the consumption of power in the second memory bank.

The foregoing description has centered primarily on the two-bank setup and on how information is read from the memory banks in that setup. In the case of a write operation on memory, the access cycles start with a command cycle followed by an address cycle, a data cycle and a busy cycle, in that order. The access cycles of the write operation are handled in the same manner as the read operation, so that high-speed memory access is implemented at a low level of power dissipation.

During each busy cycle, a command cycle for the next memory bank to be used is issued successively. This makes it possible to write and read information to and from each page of memory consecutively at high speed.

An internal register in firmware may be used to determine whether or not to carry out interleave access, i.e., a mode of access in which the pair of memory bank (bank 0) 21 and memory bank (bank 2) 22 and the pair of memory bank (bank 1) 23 and memory bank (bank 3) 24 are accessed successively.

As described, the first embodiment of this invention provides a nonvolatile-memory controlling method and a nonvolatile-memory controlling apparatus whereby the time required conventionally to access a plurality of memory banks in the nonvolatile memory 200 is reduced appreciably, as evidenced by the comparison between FIG. 2 and FIG. 4.

While one memory bank is being accessed in a busy cycle, an access command can be issued to another bank. This is a major feature of the inventive nonvolatile-memory controlling method and nonvolatile-memory controlling apparatus, permitting continuous, high-speed access to a plurality of memory banks at a reduced level of power dissipation.

As many apparently different embodiments of this invention may be made without departing from the spirit and scope thereof, it is to be understood that the invention is not limited to the specific embodiments thereof except as defined in the appended claims.

What is claimed is:

1. A nonvolatile-memory controlling method for continuously accessing a plurality of memory banks structured so as to have each memory bank accessible independently, said nonvolatile-memory controlling method comprising:
   controlling a chip enable signal for respective ones of said plurality of memory banks in order to provide an enabled state and a disabled state;

in a busy cycle of a first memory bank of said plurality of memory banks being accessed, issuing access information to a second memory bank for access thereto;

bringing said second memory bank into the enabled state while said access information is issued for said second memory bank using the chip enable signal for said second memory bank;

bringing said first memory bank while in said busy cycle into the disabled state using the chip enable signal for said first memory bank, while said access information is issued for said second memory bank;

in a busy cycle of said second memory bank, issuing access information to said first memory bank;

bringing said first memory bank into the enabled state while said access information is issued for said first memory bank using the chip enable signal for said first memory bank;

bringing said second memory bank while in said busy cycle into the disabled state using the chip enable signal for said second memory bank, while said access information is issued for said first memory bank, such that said plurality of memory banks are respectively accessed continuously but are respectively disabled during busy cycles to reduce a power consumption of said non-volatile memory.

2. The method of claim 1, further comprising:

accessing said first memory bank during a data cycle of said first memory bank, during said busy cycle of said second memory bank.

3. The method of claim 1, further comprising:

issuing a third access command to said first memory bank, during another busy cycle of said second memory bank, said first memory bank being enabled while said third command is issued for said first memory bank, said second memory bank being disabled while accessing said first memory bank.

4. The method of claim 1, wherein an access command includes at least one of a read, write and erase operation.

5. A nonvolatile-memory controlling apparatus for continuously accessing a plurality of memory banks structured so as to have each memory bank accessible independently, said nonvolatile-memory controlling apparatus comprising:

means for controlling a chip enable signal for respective ones of said plurality of memory banks in order to provide an enabled state and a disabled state;

means for issuing access information to a second memory bank in a busy cycle of a first memory bank of said plurality of memory banks;

means for bringing said second memory bank into the enabled state while said access information is issued for said second memory bank using the chip enable signal for said second memory bank;

means for bringing said first memory bank in said busy cycle into the disabled state using the chip enable signal for said first memory bank, while said access information is issued for said second memory bank;

means for issuing access information to said first memory bank in a busy cycle of said second memory bank;

means for bringing said first memory bank into the enabled state while said access information is issued for said first memory bank using the chip enable signal for said first memory bank; and means for bringing said second memory bank in said busy cycle into the disabled state using the chip enable signal for said second memory bank, while said access information is issued for said first memory bank, such that said plurality of memory banks are respectively accessed continuously but are respectively disabled during busy cycles to reduce a power consumption of said non-volatile memory.

6. The apparatus of claim 5, wherein said access information comprises an access command that includes at least one of a read, write and erase operation.

7. The apparatus of claim 6, wherein the execution of any access command comprises a command cycle, an address cycle, a data cycle, and a busy cycle.

8. A nonvolatile-memory controlling apparatus for continuously accessing a plurality of memory banks structured so as to have each memory bank accessible independently, said nonvolatile-memory controlling apparatus comprising:

a chip enable control unit, which outputs chip enable signals for respective ones of said plurality of memory banks in order to provide an enabled state and a disabled state; and a memory access and control unit, in communication with said chip enable control unit, which issues access information to a second memory bank in a busy cycle of a first memory bank of said plurality of memory banks; brings said second memory bank into the enabled state while said access information is issued for said second memory bank using the chip enable signal for said second memory bank; brings said first memory bank in said busy cycle into the disabled state using the chip enable signal for said first memory bank, while said access information is issued for said second memory bank; issues access information to said first memory bank in a busy cycle of said second memory bank; brings said first memory bank into the enabled state while said access information is issued for said first memory bank using the chip enable signal for said first memory bank; and brings said second memory bank in said busy cycle into the disabled state using the chip enable signal for said second memory bank, while said access information is issued for said first memory bank, such that said plurality of memory banks are respectively accessed continuously but are respectively disabled during busy cycles to reduce a power consumption of said non-volatile memory.

9. The apparatus of claim 8, wherein said access information comprises an access command that includes at least one of a read, write and erase operation.

10. The apparatus of claim 9, wherein the execution of any access command comprises a command cycle, an address cycle, a data cycle, and a busy cycle.

* * * * *